(12) United States Patent
Zhao et al.

(10) Patent No.: US 6,245,663 B1
(45) Date of Patent: Jun. 12, 2001

(54) IC INTERCONNECT STRUCTURES AND METHODS FOR MAKING SAME

(75) Inventors: Bin Zhao, Irvine; Maureen R. Brongo, Laguna Hills, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/163,967

(22) Filed: Sep. 30, 1998

(51) Int. Cl.$^7$ ................................................. H01L 21/4763
(52) U.S. Cl. ......................... 438/622; 438/600; 437/195
(58) Field of Search .............................. 29/576; 437/195, 437/225, 228, 235, 962; 438/230, 233, 592, 600, 610, 614, 622, 633, 666

(56) References Cited

U.S. PATENT DOCUMENTS

| | | | |
|---|---|---|---|
| 4,663,831 | * 5/1987 | Birrittella et al. | 29/576 |
| 5,565,384 | * 10/1996 | Havemann | 437/228 |
| 5,604,156 | 2/1997 | Chung et al. | 437/195 |
| 5,612,254 | * 3/1997 | Mu et al. | 437/195 |
| 5,693,563 | 12/1997 | Teong | 437/190 |
| 5,739,579 | 4/1998 | Chiang et al. | 257/635 |
| 5,741,626 | 4/1998 | Jain et al. | 430/314 |
| 5,786,268 | * 7/1998 | Gordon et al. | 438/600 |
| 5,897,349 | * 4/1999 | Agnello | 438/230 |

OTHER PUBLICATIONS

Copper Multilevel Interconnections, IBM Technical Disclosure Bulletin, vol. 33, No. 11, Apr. 1991, pp. 299–300.

J. Givens et al., Selective Dry Etching in a High Density Plasma for 0.5 um Complementary Metal–Oxide–Semiconductor Technology, 1994 American Vacuum Society, vol. 12, pp. 427–430.

B. Zhao, et al., Aluminum Dual Damascene Interconnects With Low–K Intra/Inter–Level Dielectric for Reduced Capacitance and Low Cost.

B. Zhao, et al., A Cu/Low–K Dual Damascene Interconnect for High Performance and Low Cost Integrated Circuits.

Peter Singer, Making the Move to Dual Damascene Processing, Aug. 1997, Semiconductro International/79.

\* cited by examiner

*Primary Examiner*—David Nelms
*Assistant Examiner*—Phuc T. Dang
(74) *Attorney, Agent, or Firm*—Snell & Wilmer L.L.P.

(57) ABSTRACT

Methods and structures are disclosed for advanced interconnects in sub-micron and sub-half-micron integrated circuit devices fabricated using a single damascene process. a dielectric etch-stop layer (e.g., silicon nitride) is deposited subsequent to rather than prior to CMP processing of the previous metallization layer (e.g., the conductive plug). This scheme effectively eliminates the effect of CMP-induced erosion on the etch-stop layer and therefore allows an extremely thin etch stop to be used. Moreover, a high etch-selectivity can be obtained for the trench etch, and all etch-stop material is removed from beneath the interconnect metal, thereby reducing parasitic effects. A patterned dielectric layer is used as a metal cap in place of the standard blanket silicon nitride layer, thus preventing the formation of blisters and bubbles associated with trapped moisture and gasses, and reducing interconnect capacitance.

12 Claims, 11 Drawing Sheets

DUAL DAMASCENE
FIG.1B

SINGLE DAMASCENE
FIG.1A

PRIOR ART

FIG.2A

PRIOR ART

FIG.2B

PRIOR ART

FIG.2C

PRIOR ART

FIG.2D

PRIOR ART

FIG.2E

PRIOR ART

IC INTERCONNECT STRUCTURES AND METHODS FOR MAKING SAME

TECHNICAL FIELD

The present invention relates, generally, to multilevel interconnects used in integrated circuits and, more particularly, to an improved damascene process and structure which utilizes an etch-stop layer deposited after a metal polishing step along with a patterned cap barrier layer.

BACKGROUND ART AND TECHNICAL PROBLEMS

Advanced semiconductor processing technology has permitted the fabrication of integrated circuit devices with sub-micron and sub-half-micron features sizes. This trend toward deep submicron technology (i.e., involving feature sizes less than 0.35 microns) has, in turn, driven the need for multilayer interconnects. As a result, circuit performance in the deep submicron regime is increasingly a function of the delay time of electronic signals traveling between the millions of gates and transistors present on the typical integrated circuit chip. Parasitic capacitance and resistance effects resulting from these otherwise passive interconnect structures must therefore be well-controlled. Toward this end, recent trends emphasize the use of low resistance metals (e.g., copper) in conjunction with low permittivity or low dielectric constant (low-k) dielectrics between the metal lines.

Optical lithography techniques have, for the most part, managed to keep pace with deep sub-micron requirements through the use of off-axis illumination, phase shifting masks, and other methods known in the art. However, the decreasing depth of focus that accompanies this increase in resolution requires the production of highly planar surfaces during intermediary process steps. In light of the need for highly planar surfaces, traditional metal deposition and photolithographic techniques become progressively more ineffective as line widths are scaled down and multiple layers of metal are used. For example, traditional metal deposition techniques can result in poor metal step coverage along the edges of the contact openings. Furthermore, wet chemical etch processes typically used with metals are difficult to control. While dry plasma etching may be employed with many metals, other metals with highly desirable properties (e.g., copper and gold) are generally not amenable to dry etching.

Modern semiconductor processing techniques increasingly employ Chemical-Mechanical Polishing (CMP) to create the interconnect layers, particularly where the number of layers rises above three and the conductive lines themselves are characterized by a high aspect ratio (e.g., lines on the order of 0.25 $\mu$m in width and on the order of 1.0 $\mu$m in height). In a paradigmatic CMP process, a resinous polishing pad (e.g., a polyurethane pad) is employed in conjunction with a mechanically and chemically active slurry. When pressure is applied between the polishing pad and the wafer being polished, mechanical stresses are concentrated on the exposed edges of the adjoining cells in the cellular pad. Abrasive particles within the slurry concentrated on these edges tend to create zones of localized stress at the workpiece in the vicinity of the exposed edges of the polishing pad. This localized pressure creates mechanical strain on the chemical bonds comprising the surface being polished, rendering the chemical bonds more susceptible to chemical attack by the slurry. Thus, with the correct choice of slurry, pressure, and other process conditions, a highly planar surface may be formed on the wafer. For additional information regarding CMP process, see, for example, Karlsrud, U.S. Pat. No. 5,498,196, issued March, 1996; Arai, el al., U.S. Pat. No. 5,099,614, issued March, 1992; and Arai, et al., U.S. Pat. No. 4,805,348, issued February, 1989. The entire contents of these references are hereby incorporated by reference.

A fabrication method which employs CMP techniques and which addresses many of the above concerns is the so-called "damascene" process. Damascening acquired its name from an ornamental technique, generally attributed to metal-workers in ancient Damascus, which involved scribing or incising patterns into steel (most often swords) then filling the resulting grooves with gold or silver prior to final polish. Similarly, the modern semiconductor analog of this process involves, in the broadest sense, forming patterns in a dielectric layer, filling the resulting pattern with interconnect metal, then polishing away the excess metal on the wafer surface and leaving inlaid interconnect metal features.

Figure 1A:
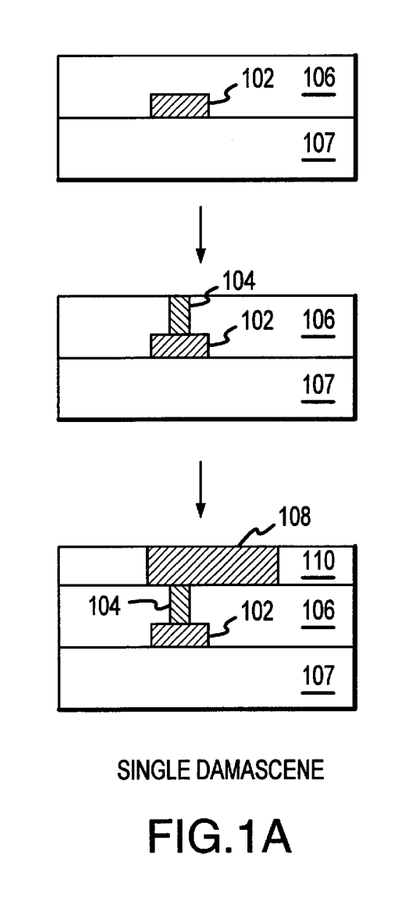
FIG. 1A is a diagrammatic illustration of a conventional single damascene interconnect process.
Figure 1B:
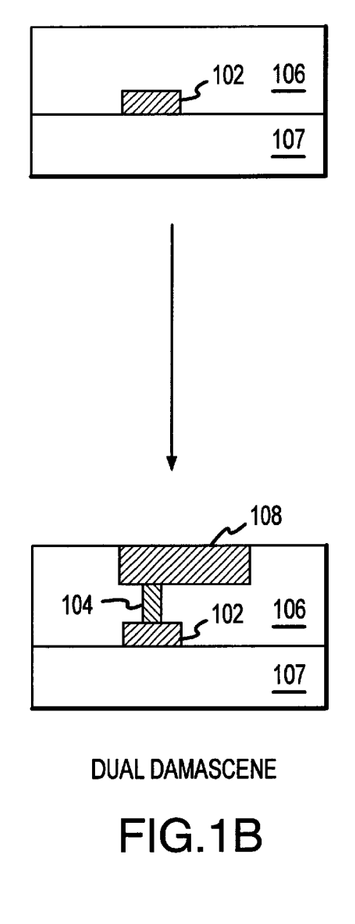
FIG. 1B is a diagrammatic illustration of a conventional dual-damascene interconnect process.

There are two major classes of damascene processes: single-damascene and dual-damascene. These two processes are illustrated in highly simplified form in FIGS. 1A and 1B (details of the various intermediary steps are discussed in further detail below). Briefly, and with reference to FIG. 1A, a single damascene process involves making contact to a lower conductor 102 (formed, for example, on substrate 107) by patterning dielectric 106 and forming a conductive plug 104 in dielectric layer 106, then patterning dielectric layer 110 and forming the actual interconnect metallization 108 in patterned dielectric layer 110. In a dual-damascene process (FIG. 1B), the interconnect layer 108 and plug 104 are formed in a single dielectric layer 106 by patterning both the via and the trench pattern into dielectric 106, then filling them simultaneously with metal. While more steps are required in a single-damascene process, this method does not suffer from many of the difficulties inherent in the dual-damascene process. For example, it is difficult to etch both a hole for plug 104 and a trench for wiring 108 within a single layer having a very high aspect ratio. Similarly, it is difficult to fill the high aspect ratio dual damascene structures to form plug 104 and wiring 108 with metals.

In cases where controlling interconnect wiring trench-depth is critical, a single-damascene process utilizing an "etch-stop" layer is often employed. In this regard, an illustrative singledamascene process is disclosed in U.S. Pat. No. 5,612,254, issued Mar. 18, 1997 to Mu et al., entitled *Methods of Forming an Interconnect on a Semiconductor Substrate* (hereinafter "Mu").

Figure 2A:
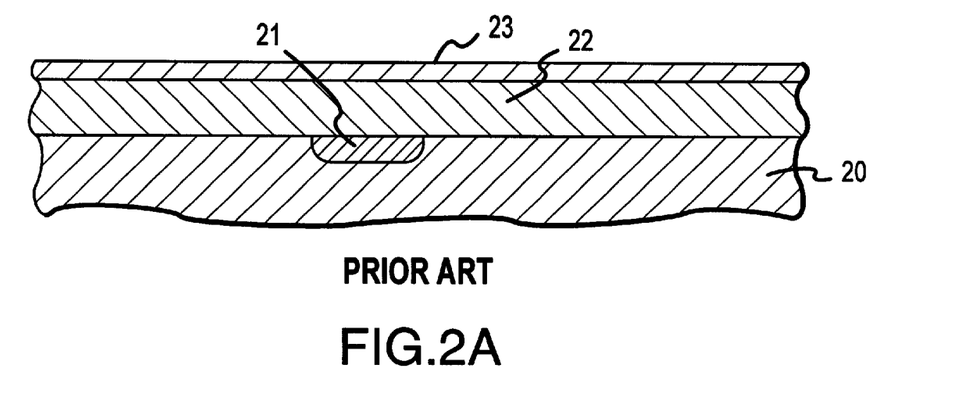
FIGS. 2A–2F shows diagrammatic cross-sectional views of a typical prior art damascene process incorporating an etch stop layer.
Figure 2B:
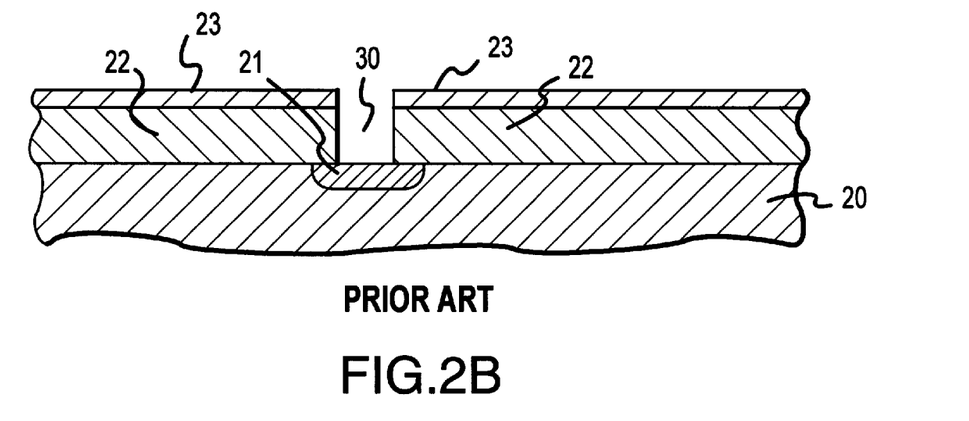
Figure 2C:
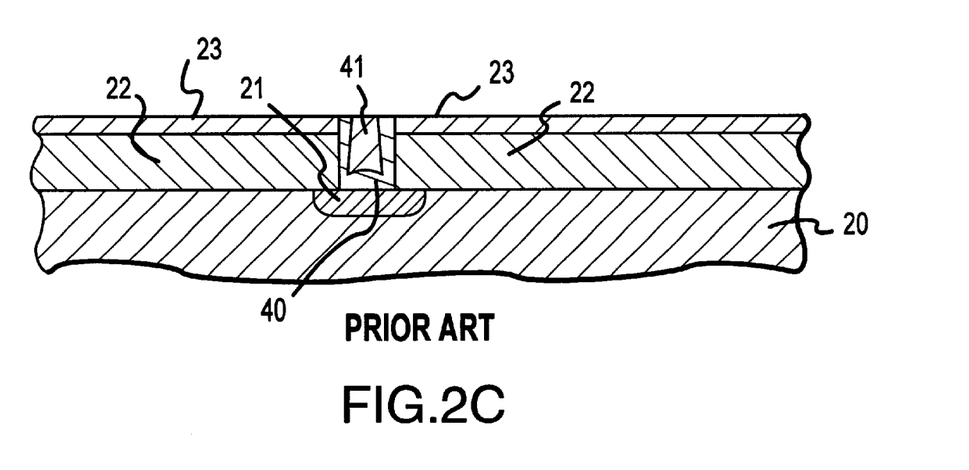

Referring now to FIGS. 2A–2F, which are taken from the Mu drawings, a silicon nitride layer 23 (the etch stop layer) and borophosphosilicate glass (BPSG) layer 22 are deposited over a substrate 20 which includes a diffused region 21 (FIG. 2A). These two layers are then patterned to form a contact opening 30 (FIG. 2B) which is then filled, using conventional techniques, with a contact plug 41 (FIG. 2C). Mu discloses a method of forming plug 41 which involves anisotropic etching of CVD-deposited tungsten and titanium nitride layers. Other known methods of forming plug 41 include, for example, using a CMP process to polish away the excess metal on the wafer surface after plug metal deposition.

Figure 2D:
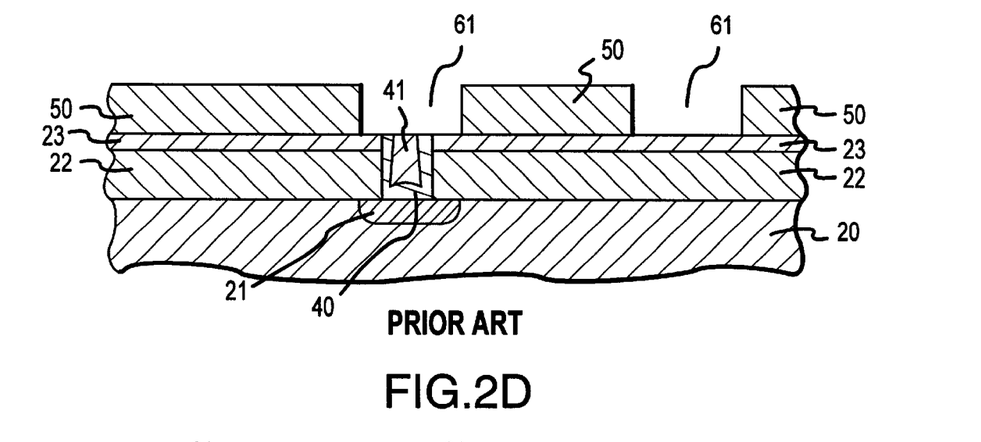
Figure 2E:
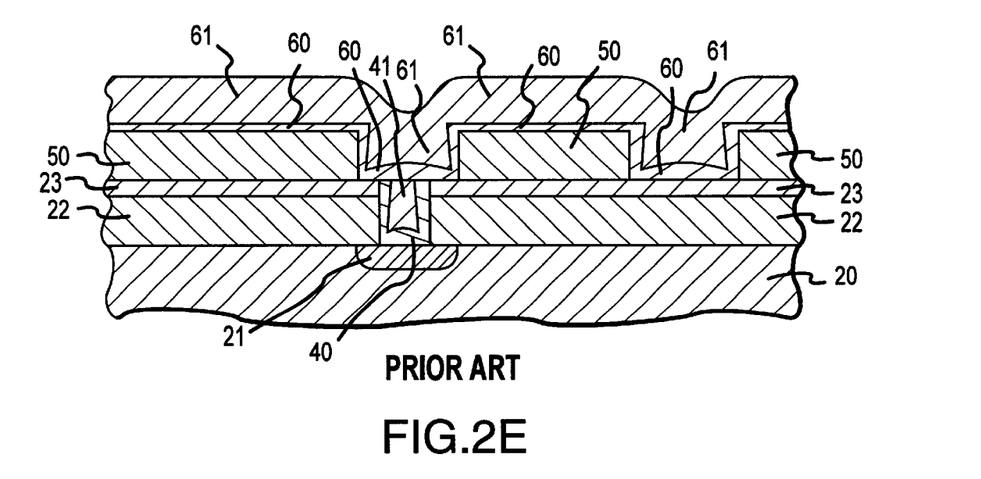
Figure 2F:
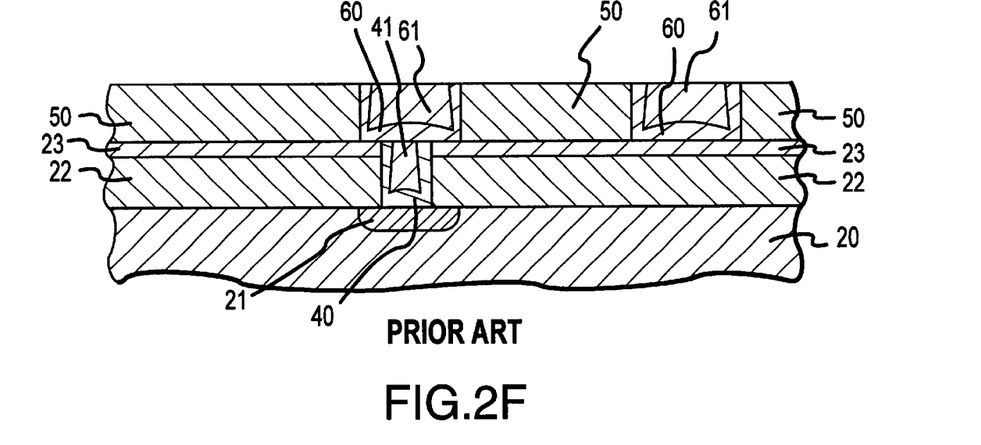

After forming plug 41, a layer 50 of silicon dioxide is deposited and dry-etched to create interconnect wiring trenches 51 (FIG. 2D). In this regard, a key aspect of the Mu disclosure lies in the etch-stop function of layer 23. That is, to the extent that layers 50 and 23 exhibit different etch rates during a particularly chosen etch process (for example Reactive Ion Etching (RIE)), etching of layer 50 proceeds until layer 23 is reached, thus producing trench 51 having a relatively uniform depth. In subsequent steps, barrier metal 60 and metal layer 61 are deposited (FIG. 2E), and the top surface is planarized using CMP to remove the excess top metal and to form interconnect wiring within trenches 61.

This and other known methods are unsatisfactory in many respects. Prior art processes, for example, utilize an etch stop layer which is deposited before CMP of the previous metal plug layer (e.g., layer 23 in FIG. 2C is deposited prior to formation of contact plug 41). As a result, significant loss of etch stop material is common during the metal CMP process. This dielectric loss during CMP is due to a number of factors. First, there is significant dielectric erosion of the etch stop layer due to chemical-mechanical effects of the slurry. That is, even when the CMP process is optimized for removal of the target metal, a measurable amount of dielectric etch stop material will nevertheless be removed.

Second, there is often a loss of dielectric material due to post-metal CMP buffing. Dielectric buffing is typically performed in order to (1) remove surface damage incurred during the metal CMP step; (2) remove surface contamination resulting from the metal CMP slurry; and (3) to reduce metal recess or dishing of large metal features. The loss of etch-stop material can be quite significant. Indeed, it has been found that, in a typical tungsten plug CMP process, dielectric loss may range from 200 Å to 1000 Å. This erosion has been found to be a strong function of the metal pattern density and the topography of the underlying structures.

Prior art processes are also unsatisfactory in that the etch-stop layer must be formed undesirably thick. More particularly, due to CMP process variation and material removal as described above, the thickness of the etch-stop dielectric must be increased beyond that which would be optimum; this ensures that there is at least a minimum etch-stop layer thickness over the entire wafer prior to the subsequent trench-etching. As stated above, this thick etch-stop layer is not uniformly removed or eroded during metal CMP. Depending upon the pattern density and the topography of the underlying structures, at some locations the etch-stop layer can be either very thick or very thin after the metal CMP. The presence of a thick dielectric layer degrades performance in that typical etch-stop materials, such as silicon nitride, have a relatively high dielectric constant, thereby increasing capacitance values between metal lines within a layer. Similarly, the presence of etch-stop material between the metal layers can degrade performance due to the resulting high capacitance.

Furthermore, the CMP process and any post-CMP cleaning steps have been known to alter the chemical and mechanical properties of the dielectric (which is in direct contact with the slurry and polishing pad), resulting in reduced etch-selectivity during the subsequent trench etching step. This greatly reduce the efficacy of the etch-stop layer.

Another disadvantage of known techniques relates to the blanket silicon nitride layer typically used over metals such as copper. Specifically, silicon nitride—which is used as a diffusion barrier for copper metallization—tends to "seal-in" moisture as well as gasses produced by many advanced dielectric materials (particularly organic low-k materials) during processing. That is, the silicon nitride prevents outgassing of the low-k dielectric. As a result, it has been found that blisters and/or bubbles can form between the interface of the silicon nitride and the previous dielectric layer, thus reducing manufacturing yield and adversely affecting long-term reliability. Moreover, the silicon nitride layer's high dielectric constant tends to increase inter-metal-line capacitance, thus degrading performance with respect to speed, power, and cross-talk.

Methods and structures are therefore needed in order to overcome these and other limitations in the prior art.

SUMMARY OF THE INVENTION

The above disadvantages of the prior art may be addressed by an improved single-damascene process. Methods according to various aspects of the present invention provide techniques for fabricating IC interconnects using a single-damascene process which incorporates an etch-stop layer deposited after processing of the previous metal plug layer. This scheme effectively eliminates the effects of CMP-induced erosion of the etch-stop layer and therefore allows an extremely thin etch stop to be used. Moreover, a high etch-selectivity can be obtained, and all etch-stop material is removed from beneath the interconnect metal.

In accordance with another aspect of the present invention, a patterned dielectric layer is used as a metal cap in place of the standard blanket silicon nitride layer, thus preventing the formation of blisters and bubbles associated with trapped moisture and gasses, and reducing interconnect capacitance.

BRIEF DESCRIPTION OF THE DRAWING FIGURES

The subject invention will hereinafter be described in conjunction with the appended drawing figures, wherein like numerals denote like elements, and.

DETAILED DESCRIPTION OF PREFERRED EXEMPLARY EMBODIMENTS

An interconnect fabrication process in accordance with various aspects of the present invention utilizes an etch stop layer deposited after CMP of the previously formed metal wiring or conductive plug layer, thereby eliminating the effect of erosion and allowing a thin etch-stop layer to be used. With momentary reference to FIG. 4I, a single-damascene process is employed wherein a contact plug 410 is formed within dielectric 402 above conductor 406, where conductor 406 may comprise any previous interconnect layer, diffusion, or the like. An etch stop layer 412 is used to form an interconnect wiring layer 420 within dielectric layer 414. In order to assure consistent thickness of interconnect layer 420, the materials used for etch stop layer 412 and dielectric layer 414 are chosen in conjunction with the particular etch process such that the etch rate of etch-stop layer 412 is substantially less than that of dielectric layer 414 during trench etch, and, likewise, is substantially greater than that of the layer 414 (and layer 402) during removal of etch stop 412.

Referring now to FIGS. 3 and 4A–4I, an interconnect fabrication process in accordance with various aspects of the present invention will now be described in detail. It should be understood that the exemplary process illustrated may include more or less steps or may be performed in the context of a larger processing scheme. At the beginning of the process (FIG. 4A), a dielectric layer 402 has been deposited over a conductor 406 formed on a substrate 404. Conductor 406 suitably comprises a layer or layers of metal (e.g., aluminum, aluminum alloys, gold, copper, copper alloys, molybdenum, silver, tungsten, etc.), polycrystalline silicon ("polysilicon"), or a variety of other conductive materials. Alternatively, conductor 406 may be a diffused region (for example, an n+ junction or implant region), to which contact is to be made.

Figure 4A:
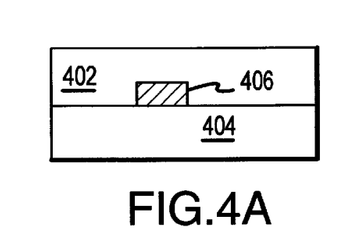
FIGS. 4A–4I are diagrammatic cross-sectional views illustrating an exemplary interconnect fabrication process in accordance with various aspects of the present invention.

Substrate 404 consists of any suitable substrate material upon which or within which semiconductor devices may be formed. Suitable materials for substrate 404 include, for example, group IV semiconductors (i.e., Si, Ge, and SiGe), group Ill-V semiconductors (i.e., GaAs, InAs, and AlGaAs), and other less-conventional materials, such as SiC, diamond, and sapphire. Substrate 404 may comprise single crystal material, or may comprise one or more polycrystalline or amorphous epitaxial layer formed on a suitable base material. It will be appreciated that substrate 404 may also comprise various devices incorporated into a semiconductor material as well as interconnect structures consisting of conductive paths and various dielectrics for isolating these conductive paths.

Dielectric 402 suitably comprises a layer or layers of silicon dioxide (doped or undoped), silicon nitride, silicon oxynitride, or low-k materials such as polyamide, poly (arylethers), parylene, polytetrafluroethylene, silsesquioxane, porous silicon dioxide, etc., or a variety of other substantially non-conductive materials. In the illustrated exemplary embodiment, dielectric 402 comprises a layer of silicon dioxide formed using a conventional chemical vapor deposition (CVD) process. As is known in the art, CVD processes can be used to deposit stable oxide layers through thermal decomposition and reaction of gaseous compounds, for example, through oxidation of silane. Alternatively, depending upon choice of materials, dielectric 402 may be formed utilizing low pressure chemical vapor deposition (LPCVD) or plasma enhanced chemical vapor deposition (PECVD). The thickness of dielectric 402 may vary in accordance with the targeted feature size. In an exemplary embodiment, dielectric 402 is a silicon dioxide layer approximately 0.3–1.0 microns thick above conductor 406 and has a substantially planar surface.

Figure 3:
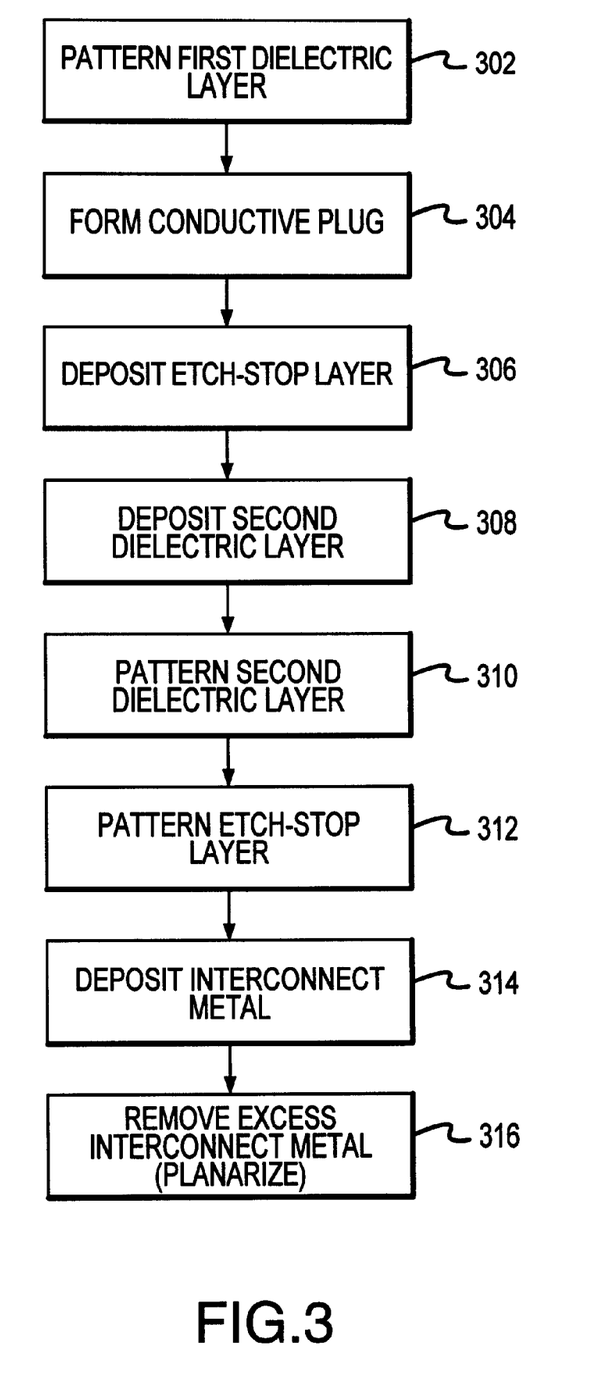
FIG. 3 is a flow chart depicting an exemplary interconnect fabrication process in accordance with various aspects of the present invention.
Figure 4B:
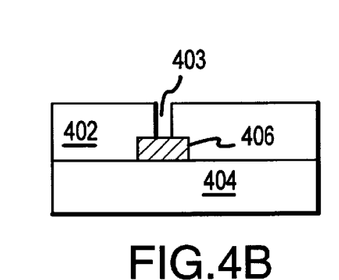

In Step 302, dielectric layer 402 is patterned in order to form a contact opening 403 extending to and exposing a portion of conductor 406 (FIG. 4B). Patterning Step 302 is suitably performed using various known lithographic techniques, for example, conventional optical lithography (including, for example, I-line and deep-UV), X-ray, or E-beam lithography. In an exemplary embodiment, a conventional optical lithography process followed by a conventional plasma-etching process is used to pattern contact opening 403 in dielectric layer 402.

Figure 4C:
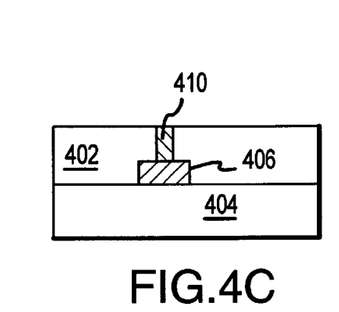

Next, in Step 304, contact opening 403 is substantially filled with conductive plug 410 as shown in FIG. 4C. Conductive plug 410 may consist of a single material or a combination of materials. Suitable materials for conductive plug 410 include, for example, titanium, TiN, tantalum, TaN, tungsten, WN, molybdenum, polysilicon, silicide, alumninum, aluminum alloy, copper, and the like. Plug 410 may be fabricated using a variety of conventional techniques. In an exemplary embodiment, Plug 410 is formed through PVD (Physical Vapor Deposition) or CVD deposition of Ti and or TiN, followed by CVD deposition of a layer of tungsten (e.g., through hydrogen reduction of $WF_6$ or $WCl_6$) The blanket W/TiN/Ti layers over the field are suitably removed by metal CMP followed by dielectric buffing—i.e., light polishing of dielectric 402. Numerous conventional CMP slurry mixtures are suitable for metal CMP of these layers, including, for example, a ferric nitrate oxidant combined with an alumina abrasive, or hydrogen peroxide combined with a silica abrasive. Dielectric buffing is suitably performed using a mixture of dilute ammonium hydroxide and silica abrasive.

Figures 4D, 4G:
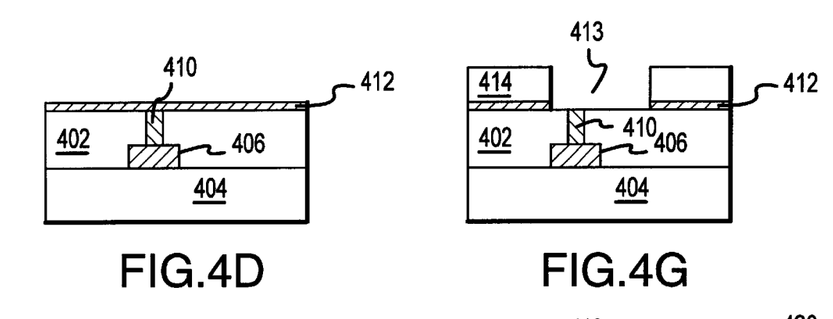

In Step 306, an etch stop layer 412 is deposited over dielectric 402 and plug 410 (FIG. 4D). Inasmuch as etch stop 412 will be used to control etch depth during subsequent steps (namely, patterning Step 310), etch stop 412 preferably comprises a material whose etch rate for a given etch process (discussed in detail below) is different from that of the dielectric layer 414 which will be deposited on etch stop layer 412. Suitable etch stop materials include, for example, various inorganic materials such as silicon nitride, silicon oxynitride, and the like. In the case where a low-dielectric constant (low-k) material such as polyamide and poly (arylethers) are used, etch stop layer may comprise silicon dioxide. In such a case, a hard mask may be employed in fabrication of the metal plugs as described below in conjunction with FIG. 8. In a preferred exemplary embodiment, etch stop layer 412 comprises a layer of silicon nitride approximately 100 to 1000 angstroms thick deposited using a conventional PECVD nitride deposition process. Depending on design standards and manufacturability limitations, etch stop layer 412 may be reduced to less than 100 angstroms.

Figure 4E:
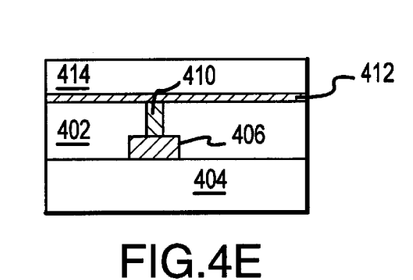

In Step 308, a second dielectric layer 414 is deposited over etch stop layer 412 (FIG. 4E). Dielectric 414 suitably comprises a layer or layers of silicon dioxide (doped or undoped), silicon nitride, silicon oxynitride, or various low-k materials as listed above. In the illustrated exemplary embodiment, dielectric 414 comprises a layer of silicon dioxide formed using a conventional CVD process. Alternatively, depending upon choice of materials, dielectric 414 may be formed utilizing low pressure chemical vapor deposition (LPCVD) or plasma enhanced chemical vapor deposition (PECVD). The thickness of dielectric 414 may vary in accordance with the targeted feature size. In an exemplary embodiment, dielectric 414 is a silicon dioxide layer approximately 0.3–1.0 microns thick.

Figure 4F:
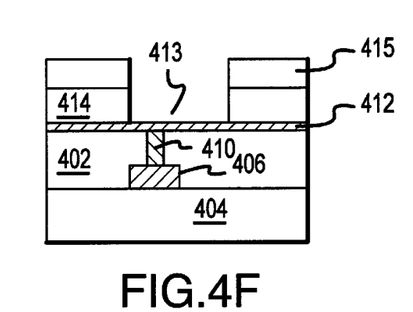

In Step 310, dielectric layer 414 is patterned to form a trench 413 (FIG. 4F). In an exemplary embodiment, conventional photoresist and plasma-etch processes are used to pattern dielectric layer 414. That is, a mask layer (e.g., photoresist 415) is applied to the top of layer 414 then exposed and removed in accordance with the desired interconnect wiring pattern. Interconnect trench 413 is then formed using a suitable etch process. Specifically, an etch process is chosen such that dielectric layer 414 and etch stop layer 412 exhibit a difference in etch rate that is sufficient to form interconnect wiring trench 413. Those skilled in the art will recognize that plasma etch variables such as gas composition, pressure, RF energy, and the like, may be optimized in accordance with choice of dielectric 402, dielectric 414, and etch stop 412. The technical literature may be consulted as to how process variables should be selected to optimize etch selectivity. See, for example, Givens et al., Selective dry etching in a high density plasma for 0.5 $\mu$m complementary metal-oxide-semiconductor technology, J. Vac. Sci. Technol. B, 427 (January/February 1994), hereby incorporated by reference.

After patterning dielectric layer 414 utilizing an etch process which stops at layer 412, the process continues with Step 312, wherein etch stop layer 412 is removed from the bottom of interconnect channel 413 using a suitable etching process. The photoresist mask used in Step 310 in conjunction with the dielectric etch step may again be used for masking during Step 312. In an exemplary embodiment, wherein etch stop layer 412 is a CVD layer of silicon nitride, a conventional nitride plasma etching process is employed for the etch-stop layer etch, as no etch-selectivity between layers 414 and 412 is required. In an alternative embodiment, the photoresist is removed before plasma-etching of etch-stop layer 412, requiring etch selectivity (i.e., layer 412 is etched with minimal attack of layers 414 and 402). In either case, photoresist 415 is preferably removed prior to Step 314.

Figure 4H:
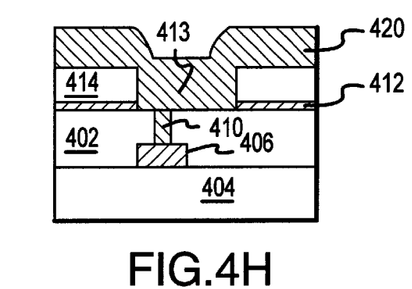

In Step 314, interconnect metal 420 is deposited within interconnect trench 413 and on top of dielectric 414 such that metal 420 makes electrical contact with conductive plug 410. Interconnect metal may consist of a layer or layers of various conductive materials, including, for example, titanium, titanium nitride, tantalum, tantalum nitride, tungsten nitride, aluminum, aluminum-copper alloys, gold, copper, silver, tungsten, or any other suitable conductive material. Depending on the choice of materials for metal 420 (e.g., in the case of copper or copper alloys), it may be advantageous to form an adhesion layer, a wetting layer, a barrier layer, and/or a seed layer between metal 420 and dielectric 402 (and 414) prior to bulk metal deposition. As is known in the art, adhesion layers generally assist in strengthening the bond between metal and dielectric layers, and barrier layers provide a barrier to prevent the migration or alloying of one material into another (for example, copper diffusion into silicon dioxide). Wetting layers promote metal-fill in high aspectratio features. In this regard, it should be appreciated that a single material may exhibit one or more of these properties in a particular context. Thus, the terms "adhesion layer", "wetting layer", and "barrier layer" as used herein are not meant to be limiting. This barrier layer may consist of a variety of materials, for example, titanium, titanium nitride, tantalum, tantalum nitride, tungsten nitride, TiSiN, TaSiN, CoWP, tungsten, and/or molybdenum. It will be appreciated that use of the term "interconnect metal" does not limit the present invention to metallic interconnects; other suitable conductors, for example, polysilicon, may be employed.

Deposition of interconnect metal 420 may be performed using conventional techniques. In an exemplary embodiment, a layer of aluminum, approximately 0.6—2.0 microns thick, is deposited using either a single PVD process, a single CVD process, or a combination of PVD and CVD processes. In an alternate embodiment, metal 420 comprises copper deposited using electrochemical deposition (or "electroplating"). Copper is desirable in that its conductivity is relatively high and it is less susceptible to electromigration failure than many metals (for example, aluminum). Many commercial tools are suitable for this copper-forming step, including, for example, the EQUINOX tool manufactured by Semitool and the SABRE tool manufactured by Novellus. Such a system suitably employs a $CuSO_4$-based bath at room temperature using a DC/pulse current waveform control. Alternatively, conventional CVD and/or high-temperature PVD processes may be employed for copper deposition. In a preferred embodiment, a barrier layer and a copper seed layer are deposited prior to forming bulk copper layer 420. The seed layer helps in delivering electron current uniformly on the wafer for initiation of copper plating. The barrier and copper seed layers are suitably formed using IMP (ion-metal-plasma) or HCM (hollow-cathode magnetron) sputtering deposition for better bottom and sidewall coverage. Alternatively, the barrier and copper seed layers may be deposited using CVD.

Figure 4I:
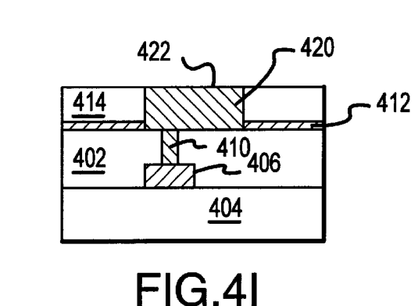

In Step 316, the excess interconnect metal 420 and corresponding adhesion/barrier/wetting layers on the field are removed, forming a substantially planar surface 422 and inlaid metal wiring 420, as shown in FIG. 4I. In an exemplary embodiment, this step is performed using a conventional CMP process with a suitable slurry. For example, a suitable slurry for aluminum CMP comprises a mixture of hydrogen peroxide and an alumina abrasive, while a suitable slurry for copper CMP comprises any of the following combinations: hydrogen peroxide and alumina; ammonium hydroxide and alumina; or nitric acid and alumina.

Thus, by virtue of etch stop 412, a well-defined interconnect trench 420 is formed in dielectric 414 and is electrically connected to conductor 406 (FIG. 4I). The etch stop material has been removed from below metal 420, thus helping to reduce parasitic capacitance between layers 420 and 406. Moreover, since etch stop layer 412 has not, in this paradigm, experienced erosion associated with the dielectric buffing in the CMP process for plug 410, layer 412 is intact and of a relatively uniform and controlled thickness before etching of trench 413. Axiomatically, etch stop layer 412 may then be designed using a lower target thickness, which also helps to lower parasitic capacitance values between the metal lines within the same metal layer.

Figure 7:
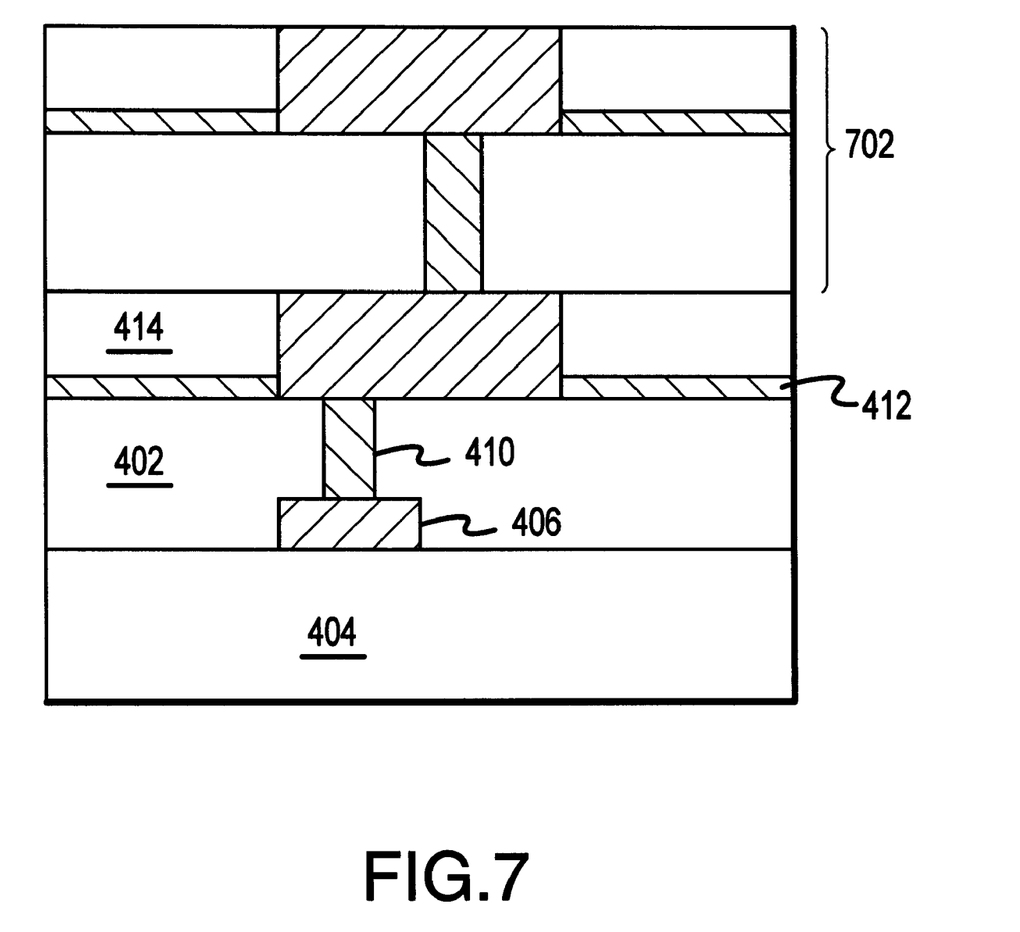
FIG. 7 is a diagranmnatic cross-sectional view illustrating the formation of additional layers in accordance with various aspects of the present invention.

Although FIG. 4 shows a two-level interconnect (i.e., conductor 406 and interconnect metal 420). It will be appreciated that multiple interconnect levels may be fabricated using methods in accordance with the present invention. More particularly, it is conceivable to deposit a dielectric layer on the system as shown in FIG. 4I and then repeat Steps 302–316 to form an interconnect to a third layer, for example, layer 702 shown in FIG. 7. This process may be repeated for an arbitrary number of interconnect layers.

Figure 8A:
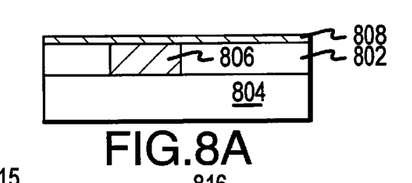
FIGS. 8A–8H are diagrammatic cross-sectional views illustrating an alternate embodiment incorporating low-k dielectric layers.
Figure 8B:
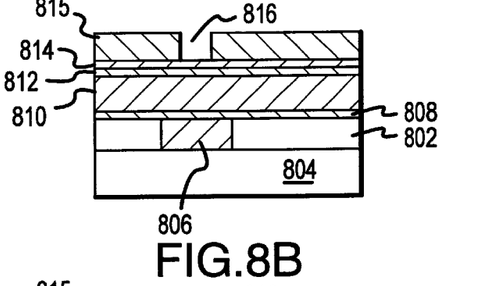

Referring now to FIGS. 8A–8N, an alternate embodiment of the present invention employing an organic low-k dielectric material will be described. First, as shown in FIG. 8A, the starting structure includes conductor 806 (e.g., copper) formed within a dielectric 802 (e.g., silicon dioxide) on a substrate 804, and covered by a cap dielectric layer 808 (e.g., silicon nitride). Next, as shown in FIG. 8B, a low-k dielectric layer 810 is formed, followed by a dielectric layer 812 (e.g., silicon nitride), a dielectric layer 814 (e.g., silicon dioxide), and a photoresist layer 815 having a via etch pattern 816 formed therein. As will be seen shortly, 812 acts as a CMP polishing stop during subsequent processing.

Figure 8C:
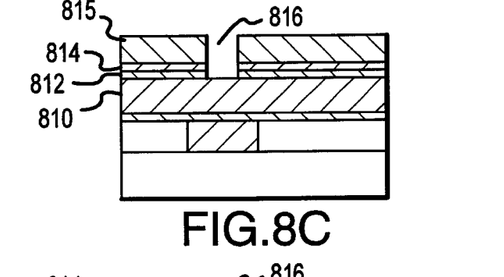
Figure 8D:
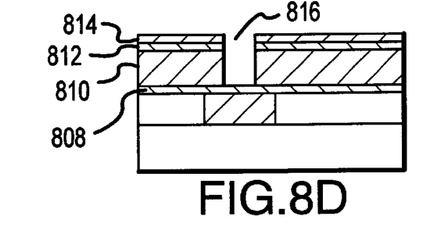
Figure 8E:
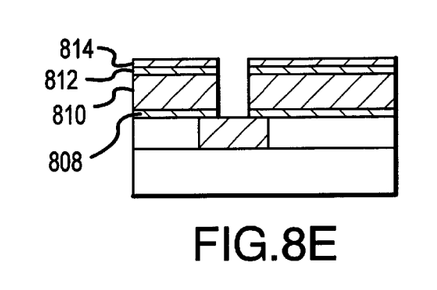

Next, as shown in FIG. 8C, a suitable etch process transfers via pattern 816 into dielectric layers 812 and 814, using, for example, carbon-fluoride based plasma in the case where layer 812 comprises silicon nitride and layer 814 comprises silicon dioxide. This pattern is then etched into organic low-k dielectric 810, preferably using an etch process which simultaneously removes photoresist layer 815 (e.g., an oxygen-based plasma process) as shown in FIG. 8D. Next, layer 808 is etched away at the bottom of via 816 (FIG. 8E). In this step, layer 814 acts to protect layer 812 due to etch selectivity between the two materials (e.g., silicon dioxide and silicon nitride, respectfully).

Figure 8F:
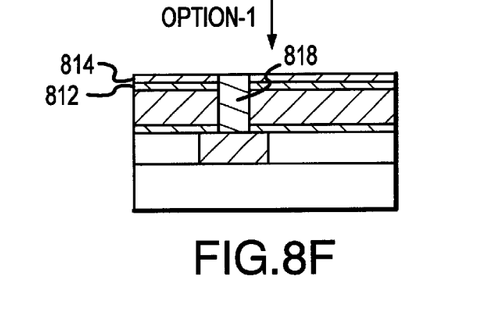
Figure 8G:
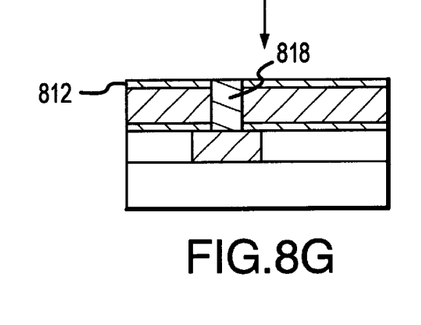
Figure 8H:
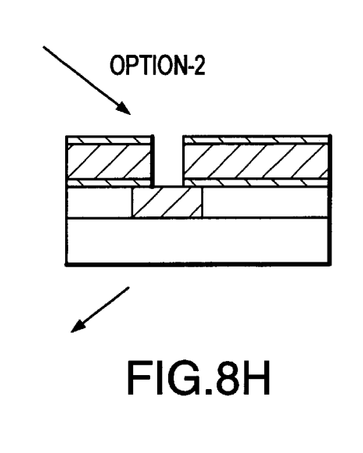

From this point, two options may be employed in order to reach the structure depicted in FIG. 8G. The first option, as shown in FIGS. 8F and 8G, involves depositing a metal layer 818 within via 816 (e.g., copper accompanied by a suitable barrier and seed layer), followed by a metal CMP process wherein layer 814 and extra metal 818 is removed from the top surface. In the second option, shown in FIGS. 81H and 8G, dielectric layer 814 is first etched away, followed by deposition and CMP of metal 818. In either case, the structure shown in FIG. 8G results.

Figure 8I:
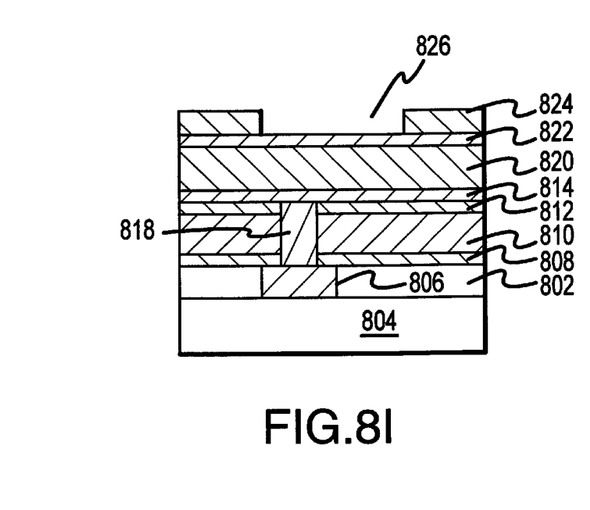
Figure 8J:
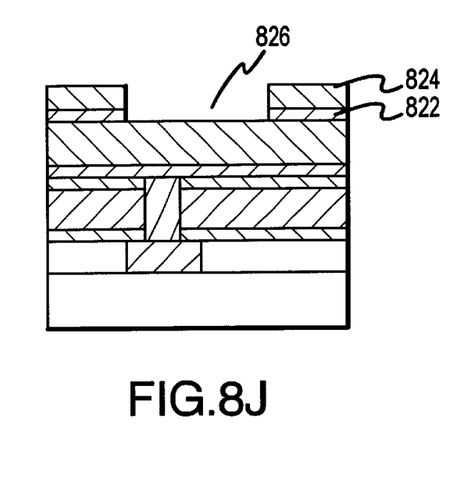
Figure 8K:
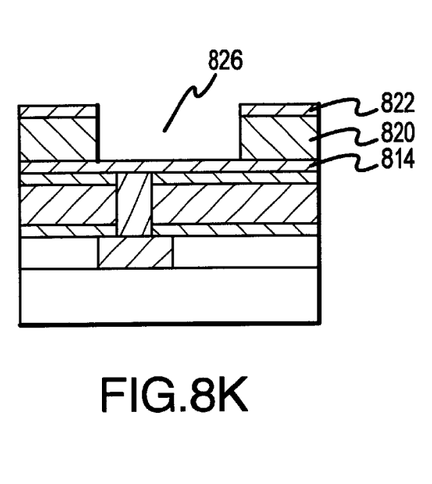

Next, as shown in FIGS. 8I–8M, the interconnect wiring is formed. As shown in FIG. 8I, a conventional dielectric layer 814 (e.g., silicon dioxide) is formed on the existing structure, followed by an organic low-k layer 820, a dielectric layer 822 (e.g., silicon nitride), and a photoresist layer 824 having a wiring pattern 824 formed therein (826). Layer 822 is then etched in accordance with pattern 826 using, for example, a carbon-fluoride plasma (FIG. 8J), followed by etching of low-k layer 820 preferably using an etch process which simultaneously removes photoresist layer 824 and low-k layer 820 (for example, an oxygen-based plasma process) while stopping at layer 814 (i.e., due to etch selectivity between layers 814 and 820) (FIG. 8K). During the etch, layer 822 will protect layer 820 after the photoresist 824 is removed as the result of the etch selectivity between layers 820 and 822.

Figure 8L:
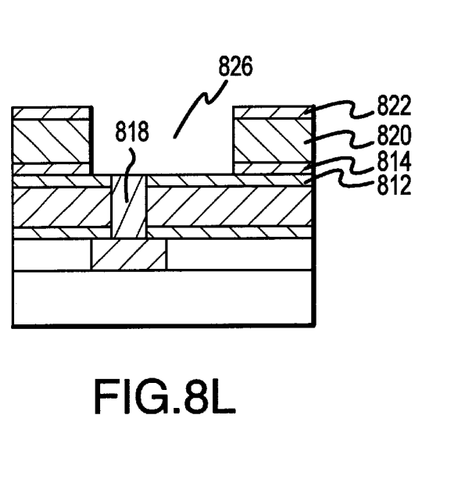
Figure 8M:
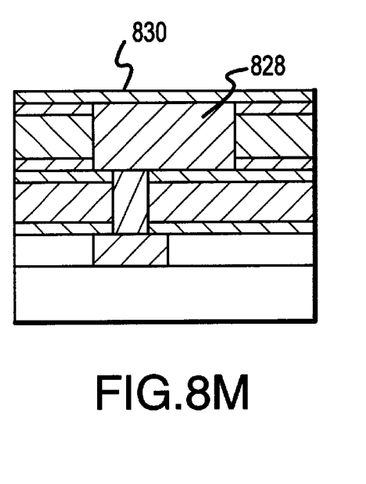

Layer 814 is then etched away at the bottom of trench 826 as shown in FIG. 8L, stopping at layer 812, and exposing metal via 818. During this etch, etch selectivity is achieved between layer 814 and each of the four layers 822, 820, 812, and 810. Finally, metal wiring layer 824 is deposited (e.g., copper in conjunction with a suitable barrier and seed layer), followed by metal CMP to remove excess metal from the top surface—with layer 822 acting as a polishing stop layer—and deposition of a cap layer 830 (e.g., silicon nitride).

Prior art methods which employ a material for layer 814 that does not exhibit etch selectivity with respect to layer 822 (e.g., silicon nitride for both layers), then layer 822 will be significantly attacked during the steps illustrated in FIGS. 8K–8L. This requires using a greater than optimal thickness for layer 822, which cannot be easily controlled. As the thickness of layer 822 increases, so does the inter-metal line capacitance. Moreover, the process window is very narrow, as both underetching and overetching can cause significant reduction in structural integrity of the interconnect layers. The present invention enables thin dielectric layers 822, 814, and 812 to be used, thereby reducing interconnect capacitance. In addition, the use of silicon dioxide in a preferred embodiment for layer 814 results in lower capacitance as compared to prior art systems which employ silicon nitride.

As mentioned briefly in the Background section, another disadvantage of known systems relates to the use of blanket silicon nitride layers over metals such as copper. Specifically, silicon nitride tends to "seal-in" moisture as well as gasses produced by many advanced dielectric materials (particularly organic low-k materials) during processing. That is, the silicon nitride prevents outgassing of the low-k dielectric. As a result, it has been found that blisters and/or bubbles can form between the interface of the silicon nitride and the previous dielectric layer, thus reducing manufacturing yield and adversely affecting long-term reliability. Moreover, the silicon nitride layer's high dielectric constant tends to increase interconnect capacitance, thus degrading performance with respect to speed, power, and cross-talk.

Figure 5A:
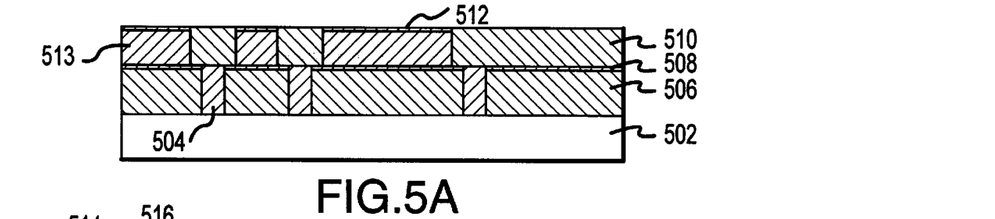
FIGS. 5A–5G are diagrammatic cross-sectional views illustrating an improved method of capping metal interconnects in accordance with an aspect of the present invention.
Figure 5B:
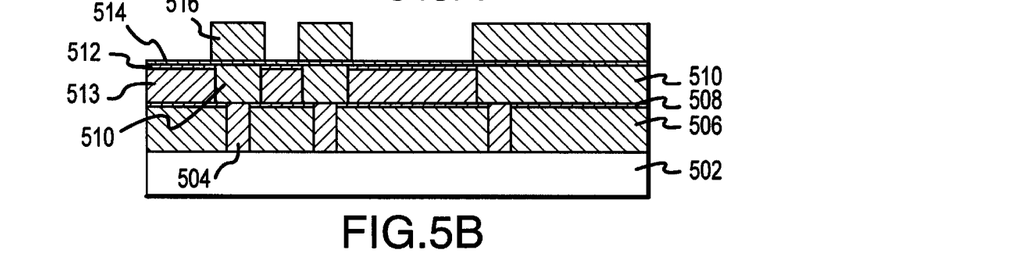
Figure 5C:
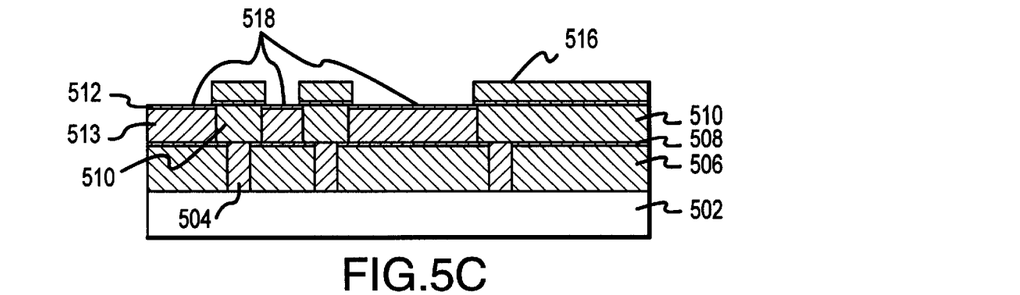
Figure 5D:
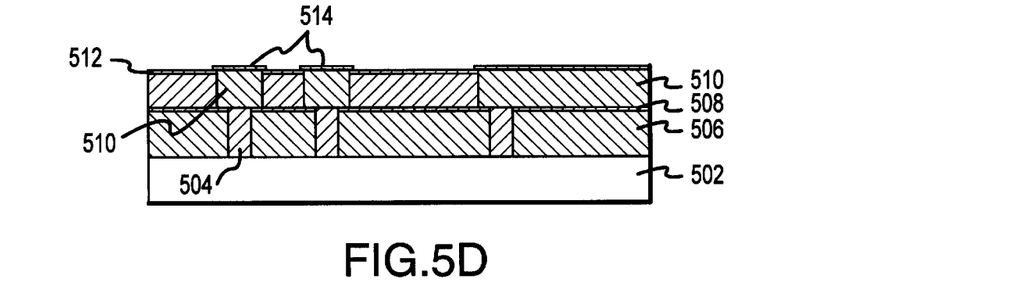
Figure 5E:
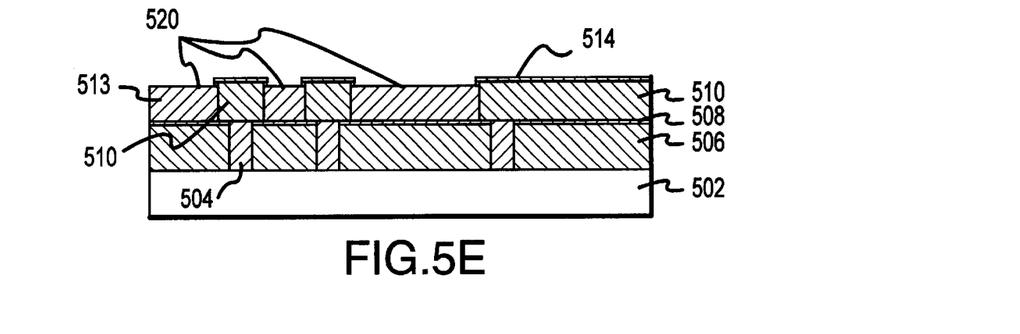
Figure 5F:
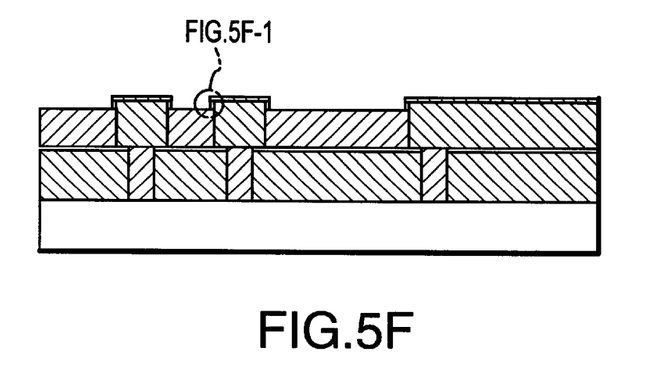
Figure 5F:
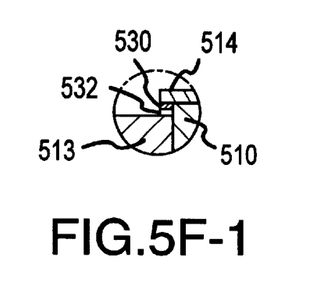
Figure 5G:
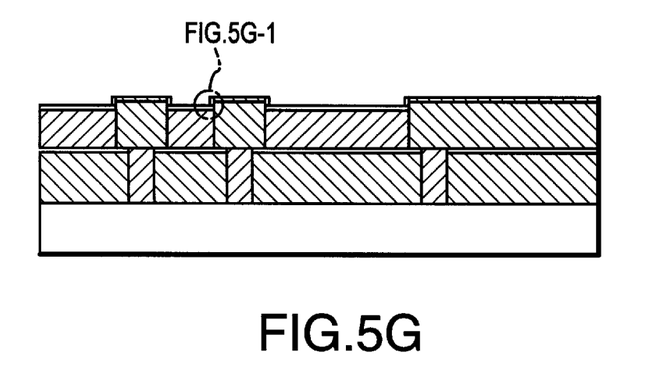
Figure 5G:
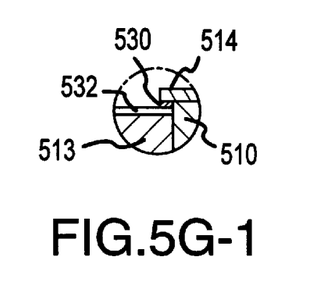
Figure 6:
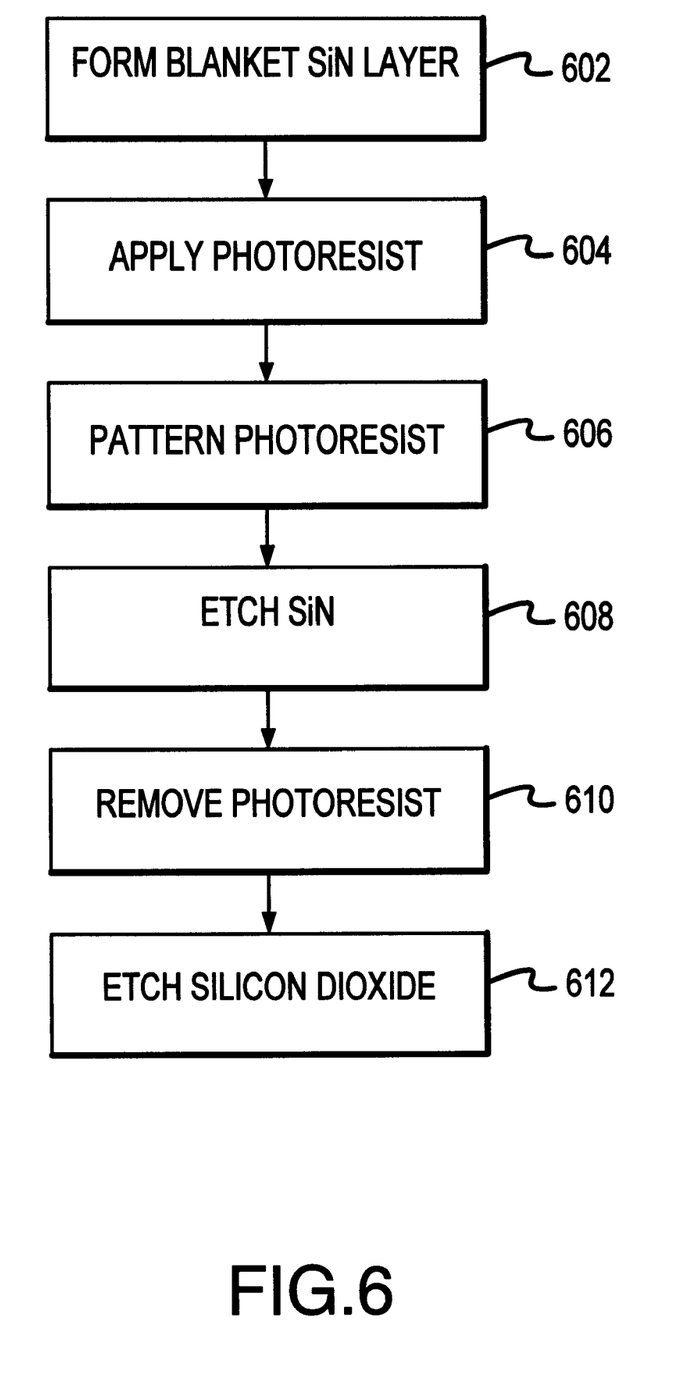
FIG. 6 is a flow chart depicting an exemplary process for capping metal interconnects in accordance with an aspect of the present invention.

Referring now to the flowchart shown in FIG. 6 and the various cross-sectional illustrations shown in FIG. 5, an exemplary method directed at solving the foregoing problems is presented. Initially, as shown in FIG. 5A, a single (or dual) damascene structure has been formed comprising a substrate 502, dielectric layers 506 and 513, etch stop layer 508 (e.g., silicon dioxide), dielectric layer 512, vias 504, and metal wiring pattern 510. This structure may form the base for subsequent damascene structures, or it might itself be the topmost layer of a multilevel structure.

Metal 510 suitably comprises any of the conductive materials previously mentioned. In a preferred embodiment, metal 510 comprises copper, and a barrier layer and copper seed layer (not shown in figure) are employed as detailed above. Furthermore, a preferred embodiment employs the following materials: one or more low-k dielectrics for layers 506 and 513, silicon dioxide (or a stack composed of silicon nitride and silicon dioxide) for layer 512, and silicon dioxide for layer 508.

In Step 602, a dielectric layer 514 is deposited over metal 510 and dielectric 512 using any suitable technique (FIG. 5B). In a preferred embodiment, layer 514 comprises a layer of PECVD silicon nitride having a thickness of about 100 to 1000 Å, preferably about 300 Å. As mentioned briefly above, barrier cap layer 514 acts to prevent or reduce diffusion of metal 510 into the overlying structures. This is of particular concern in the case where metal 510 comprises copper, as copper is known to be highly mobile within silicon dioxide and silicon, and the presence of copper in these structures can result in significant reliability problems.

Next, with continued reference to FIG. 5B, a layer of photoresist 516 is applied and patterned over portions of the underlying pattern of wiring metal 510 (Steps 604 and 606). Patterning is suitably performed using various known lithographic techniques, for example, conventional optical lithography (including, for example, I-line and deep-UV), X-ray, or E-beam lithography. In an exemplary embodiment, a conventional optical lithography process is followed by a conventional plasma-etching process. In an exemplary embodiment, this etch is chosen such that silicon nitride is etched but silicon dioxide is not Note that the removal of selected areas of layers 512 and 514 is aimed at forming a release path for outgassing. Thus, it is not necessary for the cap layer to mimic wiring metal 510; the specific pattern need only provide an escape route through the various layers such that blisters and other related reliability concerns are reduced or eliminated.

In Step 608, the exposed silicon nitride is etched using any suitable plasma etch process to expose the underlying dielectric layer 512 (e.g., silicon dioxide) in regions 518 between photoresist lines 516 (FIG. 5C). Next, in Step 610, the photoresist material 516 is suitably removed (for example, using an oxygen-based plasma) as shown in FIG. 5D. Layer 512 acts to protect the underlying dielectric layer 513 during this step.

After photoresist strip, dielectric layer 512, which preferably comprises CVD silicon dioxide, is etched using any suitable conventional etching technique (FIG. 5E). As silicon nitride layer 514 is used as a cap barrier for metal 510, the etch used in Step 612 should exhibit a high etch-selectivity between silicon dioxide and silicon nitride (as well as layer 513). As mentioned above, those skilled in the art are well acquainted with optimization of plasma etching parameters. In an alternate embodiment, this step is not carried out, and dielectric layer 512 remains within the structure. The advantage of removing this layer, however, is that it reduces inter-metal line capacitance and enhances the degassing ability of the structure.

After completion of the process set forth in FIG. 6, the metal pattern 5 10 will be capped by a patterned layer of silicon nitride 514. In the case where metal 510 comprises copper, this patterned nitride layer 514 acts as a diffusion barrier to prevent the copper from migrating or diffusing into surrounding dielectrics. At the same time, nitride layer 514 and, in some embodiments, oxide layer 512 are removed from dielectric 513 in regions 520. This allows outgassing of dielectrics 513 and 506, and prevents the trapping of moisture and other gasses within the structure, thus preventing the formation of bubbles and blisters. At the same time, the high dielectric constant material (i.e., silicon nitride and, optionally, silicon dioxide) has been removed from between metal lines 504, thus improving performance speed, power, and cross-talk.

In an alternate embodiment layer 512 comprises a dual dielectric layer, for example, a layer of silicon nitride formed on a layer of silicon dioxide. In this way, the top layer acts as a polishing stop during metal CMP (e.g., the metal CMP process necessary to form the top surface of the structure shown in FIG. 5A). This top layer may then be removed during an added processing step or during etching of layer 514 if similar or the same materials are used (e.g., if both layers are silicon nitride). Two such finished structures are depicted in FIGS. 5F and 5G. FIG. 5F shows the case where the lower dielectric in the stack (e.g., silicon dioxide) is removed over a portion of low-k dielectric 513. As shown in the inset drawing, this results in a cap structure wherein the cap 514 covers and extend a short distance down metal 510, followed by a section of the top layer 530 of the stack, followed by a section of the bottom layer 532 of the stack which contacts low-k dielectric 513. FIG. 5G, in contrast, shows the case where layer 532 substantially remains over low-k layer 513. here, cap 514 covers metal 510, followed by a section of layer 530, which contacts the remaining layer 532. It will be apparent that the structure shown in FIG. 5F is likely to be superior with respect to outgassing.

Although the invention has been described herein in conjunction with the appended drawings, those skilled in the art will appreciate that the scope of the invention is not so limited. Various modifications in the selection, design, and arrangement of the various components and steps discussed herein may be made without departing from the scope of the invention as set forth in the appended claims.

What is claimed is:

1. A method for forming an interconnect to a conductor in an integrated circuit, said method comprising the steps of:
   (a) forming a first dielectric layer over said conductor;
   (b) patterning said first dielectric layer to create a first opening extending to said conductor;
   (c) forming a conductive plug within said first opening such that said conductive plug substantially fills said first opening and is electrically continuous with said conductor;
   (d) forming an etch-stop layer on said first dielectric layer and said conductive plug;
   (e) forming a second dielectric layer on said etch-stop layer;
   (f) patterning said second dielectric layer and said etch-stop layer to form an interconnect channel such that said dielectric layer and said etch-stop layer exhibit different etch rates;
   (g) forming an interconnect metal layer over said second dielectric layer and within said interconnect channel such that said interconnect metal layer is electrically continuous with said conductive plug;
   (h) removing excess regions of said interconnect metal layer from said second dielectric layer to form a substantially planar surface.

2. The method of claim 1, wherein said step of patterning said second dielectric layer and said etch-stop layer comprises the steps of:
   forming a photoresist layer on said second dielectric layer;
   patterning said photoresist layer to form a photoresist pattern;
   etching said second dielectric layer in accordance with said photoresist pattern;
   etching said etch-stop layer in accordance with said photoresist pattern to expose at least a portion of said conductive plug;
   removing said photoresist pattern.

3. The method of claim 1, wherein said step of patterning said second dielectric layer and said etch-stop layer comprises the steps of:
   forming a photoresist layer on said second dielectric layer;
   patterning said photoresist layer to form a photoresist pattern;
   etching said second dielectric layer in accordance with said photoresist pattern;
   removing said photoresist pattern;
   etching said second etch-stop layer to expose at least a portion of said conductive plug.

4. A method for forming an interconnect to a conductor in an integrated circuit, said method comprising the steps of:
   (a) forming a first dielectric layer over said conductor;
   (b) patterning said first dielectric layer to create a first opening extending to said conductor;
   (c) forming a conductive plug within said first opening such that said conductive plug substantially fills said first opening and is electrically continuous with said conductor;
   (d) forming an etch-stop layer on said first dielectric layer and said conductive plum;
   (e) forming a second dielectric layer on said etch-stop layer;
   (f) patterning said second dielectric layer and said etch-stop layer to form an interconnect channel such that said dielectric layer and said etch-stop layer exhibit different etch rates;
   (g) forming an interconnect metal layer over said second dielectric layer and within said interconnect channel such that said interconnect metal layer is electrically continuous with said conductive plug, further including the step of forming a barrier layer between said first dielectric layer and said interconnect metal;

(h) removing excess regions of said interconnect metal layer from said second dielectric layer to form a substantially planar surface.

5. A single damascene interconnect structure comprising:

a conductor;

a first dielectric layer disposed on said conductor, said first dielectric layer having a conductive plug extending therethrough for contacting said conductor;

an etch-stop layer disposed on said first dielectric layer, said etch-stop layer having an etch-stop layer pattern;

a second dielectric layer disposed on said etch-stop layer, said second dielectric layer having a second dielectric layer pattern, wherein said etch-stop layer pattern substantially corresponds to said second dielectric layer pattern;

an interconnect metal layer formed within said etch-stop layer pattern and said second dielectric layer pattern such that said interconnect metal layer is electrically continuous with said conductive plug.

6. A method for capping a substantially planar surface comprising a metal pattern formed within a first dielectric layer, said method comprising the steps of:

(a) forming a second dielectric layer over said substantially planar surface;

(b) patterning said second dielectric layer such that said second dielectric pattern covers at least a portion of said metal pattern;

(c) patterning said first dielectric layer such that said first dielectric layer pattern substantially conforms to said second dielectric pattern.

7. A method for forming an interconnect to a conductor in an integrated circuit, said method comprising the steps of:

(a) forming a first dielectric layer over said conductor;

(b) patterning said first dielectric layer to create a first opening extending to said conductor;

(c) forming a conductive plug within said first opening such that said conductive plug substantially fills said first opening and is electrically continuous with said conductor;

(d) forming an etch-stop layer on said first dielectric layer and said conductive plug;

(e) forming a second dielectric layer on said etch-stop layer;

(f) patterning said second dielectric layer and said etch-stop layer to form an interconnect channel such that said dielectric layer and said etch-stop layer exhibit different etch rates;

(g) forming an interconnect metal layer over said second dielectric layer and within said interconnect channel such that said interconnect metal layer is electrically continuous with said conductive plug;

(h) removing excess regions of said interconnect metal layer from said second dielectric layer to form a substantially planar surface;

(i) forming a cap dielectric layer over said substantially planar surface;

(j) patterning said cap dielectric layer such that said second dielectric pattern covers at least a portion of said metal pattern, and has an outgassing path formed therein.

8. A method for forming an interconnect to a conductor in an integrated circuit, said method comprising the steps of:

(a) forming, a first dielectric layer over said conductor;

(b) patterning said first dielectric layer to create a first opening extending to said conductor;

(c) forming a conductive plug within said first opening such that said conductive plug substantially fills said first opening and is electrically continuous with said conductor;

(d) forming an etch-stop layer on said first dielectric layer and said conductive plug;

(e) forming a second dielectric layer on said etch-stop layer;

(f) patterning said second dielectric layer and said etch-stop layer to form an interconnect channel such that said dielectric layer and said etch-stop layer exhibit different etch rates;

(g) forming an interconnect metal layer over said second dielectric layer and within said interconnect channel such that said interconnect metal layer is electrically continuous with said conductive plus;

(h) removing excess regions of said interconnect metal layer from said second dielectric layer to form a substantially planar surface;

(i) forming a cap dielectric layer over said substantially planar surface;

(j) patterning said cap dielectric layer such that said second dielectric pattern covers at least a portion of said metal pattern;

(k) patterning said second dielectric layer such that said cap dielectric layer pattern substantially conforms to said second dielectric pattern.

9. A cap structure comprising:

a metal conductor formed within a low-k dielectric layer;

a cap dielectric layer formed on said metal conductor and having an outgassing path formed therein.

10. The cap structure of claim 9, wherein said metal conductor comprises copper.

11. The cap structure of claim 9, wherein said cap dielectric layer comprises silicon nitride.

12. The cap structure of claim 9, wherein said low-k dielectric layer comprises an organic low-k dielectric.

* * * * *